(12) United States Patent
Becker et al.

(10) Patent No.: US 8,018,837 B2
(45) Date of Patent: *Sep. 13, 2011

(54) SELF-HEALING CHIP-TO-CHIP INTERFACE

(75) Inventors: Wiren D. Becker, New York, NY (US);
Daniel M. Dreps, Georgetown, TX (US); Frank D. Ferraiolo, Essex Junction, VT (US); Anand Haridass, Austin, TX (US); Robert J. Reese, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/635,121

(22) Filed: Dec. 10, 2009

(65) Prior Publication Data

US 2010/0085872 A1    Apr. 8, 2010

Related U.S. Application Data

(63) Continuation of application No. 11/948,620, filed on Nov. 30, 2007, now Pat. No. 7,813,266, which is a continuation of application No. 10/339,757, filed on Jan. 9, 2003, now Pat. No. 7,362,697.

(51) Int. Cl.
*G01R 31/08* (2006.01)

(52) U.S. Cl. ........................................ 370/217; 710/305

(58) Field of Classification Search .......... 370/225–228, 370/248, 217; 710/305; 714/25, 43, 56
See application file for complete search history.

(56) References Cited

U.S. PATENT DOCUMENTS

| 4,345,251 A | * | 8/1982 | Begeman et al. ............ 340/2.26 |
| 4,635,261 A | | 1/1987 | Anderson et al. |
| 4,737,830 A | | 4/1988 | Patel et al. |
| 4,799,039 A | * | 1/1989 | Balcom et al. ................ 340/333 |
| 4,879,559 A | | 11/1989 | Arambepola |
| 5,021,944 A | | 6/1991 | Sasaki et al. |
| 5,069,521 A | | 12/1991 | Hardwick |
| 5,086,427 A | | 2/1992 | Whittaker et al. |
| 5,159,598 A | * | 10/1992 | Welles et al. ................. 714/724 |
| 5,278,771 A | * | 1/1994 | Nyenya ...................... 700/293 |
| 5,349,654 A | | 9/1994 | Bond et al. |

(Continued)

FOREIGN PATENT DOCUMENTS

EP    1113363 A2    12/2000

(Continued)

OTHER PUBLICATIONS

Analysis of On-Chip Fault-Tolerant Distributed Algorithms, Wien, Jun. 2010.*

(Continued)

*Primary Examiner* — Salman Ahmed
(74) *Attorney, Agent, or Firm* — Yee & Associates, P.C.; Matthew W. Baca

(57) ABSTRACT

A method, apparatus, and computer instructions for managing a set of signal paths for a chip. A defective signal path within the set of signal paths for the chip is detected. Signals are re-routed through the set of signal paths such that the defective signal path is removed from the set of signal paths and sending signals using remaining data signal paths in the set of signal paths and using an extra signal path in response to detecting the defective signal path.

4 Claims, 5 Drawing Sheets

U.S. PATENT DOCUMENTS

| | | | |
|---|---|---|---|
| 5,398,236 | A | 3/1995 | Hemmandy et al. |
| 5,592,632 | A | 1/1997 | Leung et al. |
| 5,666,480 | A | 9/1997 | Leung et al. |
| 5,706,277 | A | 1/1998 | Klink |
| 5,742,840 | A | 4/1998 | Hansen et al. |
| 5,748,872 | A | 5/1998 | Norman |
| 5,757,265 | A | 5/1998 | Kogure et al. |
| 5,757,298 | A | 5/1998 | Manley et al. |
| 5,860,080 | A | 1/1999 | James et al. |
| 5,867,422 | A | 2/1999 | John |
| 5,898,863 | A | 4/1999 | Ofer et al. |
| 5,907,562 | A | 5/1999 | Wrape et al. |
| 5,955,910 | A * | 9/1999 | Levin et al. .................. 327/393 |
| 5,991,891 | A | 11/1999 | Hahn et al. |
| 5,996,038 | A | 11/1999 | Looi et al. |
| 6,006,318 | A | 12/1999 | Hansen et al. |
| 6,023,178 | A * | 2/2000 | Shioya et al. ................. 327/176 |
| 6,034,878 | A | 3/2000 | Osaka et al. |
| 6,038,682 | A | 3/2000 | Norman |
| 6,052,373 | A | 4/2000 | Lau |
| 6,092,229 | A | 7/2000 | Boyle et al. |
| 6,125,419 | A | 9/2000 | Umemura et al. |
| 6,128,750 | A | 10/2000 | Espy et al. |
| 6,151,648 | A | 11/2000 | Haq |
| 6,154,826 | A | 11/2000 | Wulf et al. |
| 6,154,855 | A | 11/2000 | Norman |
| 6,160,423 | A | 12/2000 | Haq |
| 6,185,644 | B1 | 2/2001 | Farnwald et al. |
| 6,255,859 | B1 | 7/2001 | Haq |
| 6,263,413 | B1 | 7/2001 | Motomura et al. |
| 6,266,712 | B1 * | 7/2001 | Henrichs ......................... 710/8 |
| 6,311,288 | B1 | 10/2001 | Heeren et al. |
| 6,316,980 | B1 | 11/2001 | Vogt et al. |
| 6,317,352 | B1 | 11/2001 | Halbert et al. |
| 6,327,205 | B1 | 12/2001 | Haq |
| 6,345,321 | B1 | 2/2002 | Litaize et al. |
| 6,369,605 | B1 | 4/2002 | Bonella et al. |
| 6,389,494 | B1 | 5/2002 | Walton et al. |
| 6,408,402 | B1 | 6/2002 | Norman |
| 6,449,213 | B1 | 9/2002 | Dodd et al. |
| 6,487,102 | B1 | 11/2002 | Halbert et al. |
| 6,493,250 | B2 | 12/2002 | Halbert et al. |
| 6,502,161 | B1 | 12/2002 | Perego et al. |
| 6,505,305 | B1 | 1/2003 | Olarig |
| 6,513,080 | B1 | 1/2003 | Haq |
| 6,571,355 | B1 | 5/2003 | Linnell |
| 6,625,687 | B1 | 9/2003 | Halbert et al. |
| 6,643,752 | B1 | 11/2003 | Donelly et al. |
| 6,880,112 | B2 | 4/2005 | Lajolo |
| 6,934,900 | B1 | 8/2005 | Cheng et al. |
| 6,956,249 | B2 | 10/2005 | Sittig et al. |
| 6,961,347 | B1 | 11/2005 | Bunton et al. |
| 6,965,249 | B2 | 11/2005 | Lane et al. |
| 6,982,954 | B2 | 1/2006 | Dhong et al. |
| 7,047,458 | B2 | 5/2006 | Nejedlo et al. |
| 7,106,644 | B2 | 9/2006 | Chou |
| 7,127,629 | B2 | 10/2006 | Vogt |
| 7,143,207 | B2 | 11/2006 | Vogt |
| 7,165,153 | B2 | 1/2007 | Vogt |
| 7,180,324 | B2 | 2/2007 | Chan et al. |
| 7,194,581 | B2 | 3/2007 | Vogt |
| 7,200,787 | B2 | 4/2007 | Vogt et al. |
| 7,212,423 | B2 | 5/2007 | Vogt |
| 7,215,140 | B1 | 5/2007 | Saini et al. |
| 7,219,294 | B2 | 5/2007 | Vogt |
| 7,362,697 | B2 * | 4/2008 | Becker et al. .................. 370/217 |
| 7,554,276 | B2 * | 6/2009 | Galli et al. ..................... 318/109 |
| 7,813,266 | B2 * | 10/2010 | Becker et al. .................. 370/217 |
| 2002/0006067 | A1 | 1/2002 | Kim et al. |
| 2002/0013929 | A1 | 1/2002 | Maciver |
| 2002/0163881 | A1 | 11/2002 | Dhong et al. |
| 2003/0037278 | A1 | 2/2003 | Olarig |
| 2003/0072185 | A1 | 4/2003 | Lane et al. |
| 2003/0174567 | A1 | 9/2003 | Kim et al. |
| 2004/0068682 | A1 | 4/2004 | Takei et al. |
| 2004/0073829 | A1 | 4/2004 | Olarig |
| 2004/0117709 | A1 | 6/2004 | Nejedlo et al. |
| 2004/0136319 | A1 | 7/2004 | Becker et al. |
| 2004/0246785 | A1 | 12/2004 | Vogt |
| 2004/0246786 | A1 | 12/2004 | Vogt |
| 2004/0250181 | A1 | 12/2004 | Vogt et al. |
| 2005/0022065 | A1 | 1/2005 | Dixon et al. |
| 2005/0108458 | A1 | 5/2005 | Vogt |
| 2005/0108465 | A1 | 5/2005 | Vogt |
| 2005/0116222 | A1 | 6/2005 | Chou |
| 2005/0264318 | A1 | 12/2005 | Chan et al. |
| 2005/0268061 | A1 | 12/2005 | Vogt |
| 2006/0004953 | A1 | 1/2006 | Vogt |
| 2006/0004968 | A1 | 1/2006 | Vogt |
| 2006/0098699 | A1 * | 5/2006 | Sanchez ........................ 372/26 |
| 2006/0190767 | A1 | 8/2006 | Nair |
| 2007/0109247 | A1 | 5/2007 | Koyama et al. |
| 2007/0120545 | A1 * | 5/2007 | Hata et al. ..................... 323/282 |
| 2008/0074998 | A1 * | 3/2008 | Becker et al. ................. 370/228 |
| 2009/0077279 | A1 * | 3/2009 | Golbus et al. .................. 710/61 |
| 2010/0085872 | A1 * | 4/2010 | Becker et al. ................. 370/225 |
| 2010/0164579 | A1 * | 7/2010 | Acatrinei ..................... 327/172 |

FOREIGN PATENT DOCUMENTS

| | | |
|---|---|---|
| JP | 49123746 A | 11/1974 |
| JP | 52124830 A | 10/1977 |
| JP | 52132649 A | 11/1977 |
| JP | 62503188 T | 12/1987 |
| JP | 63042485 A | 2/1988 |
| JP | 63182585 A | 7/1988 |
| JP | 4093675 A | 3/1992 |
| JP | 04-305748 | 10/1992 |
| JP | 06-161912 | 6/1994 |
| JP | 09064853 A | 3/1997 |
| WO | 9930240 | 6/1999 |
| WO | 9941666 | 8/1999 |
| WO | 9941667 | 8/1999 |
| WO | 02057930 A2 | 7/2002 |

OTHER PUBLICATIONS

Stenzel et al., "Fault-Tolerance in Parallel Architectures with Crosspoint Switches", CompEuro '91, Advanced Computer Technology, Reliable Systems and Applications, 5th Annual European Computer Conference, Proceedings, May 13-16, 1991, pp. 480-486.

The Institute of Electrical and Electronics Engineers, Inc., "IEEE Standard for Scalable Coherent Interface (SCI)", May 23, 2001, pp. 1-243.

NG, "Fast Computer Memories", IEEE Spectrum, Oct. 1992, pp. 36-39.

Salters, "Fast DRAMs for Sharper TV", IEEE Spectrum, Oct. 1992, pp. 40-42.

Jones, "A New Era of Fast Dynamic RAMs", IEEE Spectrum 1992, pp. 43-49.

Farmwald et al., "A Fast Path to One Memory", IEEE Spectrum, Oct. 1992, pp. 50-51.

Gjessing et al., "A RAM Link for High Speed", IEEE Spectrum, Oct. 1992, pp. 52-53.

The Institute of Electrical and Electronics Engineers, Inc., "IEEE Standard for High-Bandwidth Memory Interface Based on Scalable Coherent Interface (SCI) Signaling Technology (RamLink)", 1996, pp. 1-91.

USPTO Noticer of Allowance for U.S. Appl. No. 11/948,620 dated Jun. 4, 2010.

Tront et al., A gate array implementation of a fault-tolerant bus interface unit based on NuBus protocols:, IEEE Proceedings of Digital Object Identifier: 10.1109/SECON.1991.147717 Published 1991.

Komatsu et al., "An optimization of bus inteerconnects pitch for low-power and reliable bus encoding scheme", Proceedings 2006 IEEE International Symposium on Circuits and Systems, 2006.

Japanese Office Action dated Apr. 27, 2010.

JP office action dated Nov. 16, 2010 (translation of portion of appeal decision that mentions reference) 1 page.

USPTO office action for U.S. Appl. No. 12/886,404 dated Mar. 29, 2011.

* cited by examiner

SELF-HEALING CHIP-TO-CHIP INTERFACE

This application is a continuation of application Ser. No. 11/948,620, filed Nov. 30, 2007, status pending, which in turn is a continuation of application Ser. No. 10/339,757, filed Jan. 9, 2003, status issued on Apr. 22, 2008, as U.S. Pat. No. 7,362,697.

BACKGROUND OF THE INVENTION

1. Technical Field

The present invention relates generally to an improved data processing system, and in particular, to a method and apparatus for routing data. Still more particularly, the present invention provides a method and apparatus for routing data between chips across a bus.

2. Description of Related Art

As computer systems become increasingly more complex, the number of interconnections between integrated circuits also increases. The number of interconnections between chips, such as microprocessors, memory, and input/output chips is increasing to numbers, such as tens of thousands of interconnections between chips in a computer system. All of these signals sent between different components pass through a chip's package or module, a board, and possibly across a connector to another board and then to another module arriving at a final destination. All of these signal paths are required to be manufactured and remain defect free to avoid the possibility of a system failure.

A service call is required when a defective component is present or a working component fails. The defective or failing component often causes part or all of the computer system to be unavailable.

Further, during testing and manufacturing of components, any components identified with defects, such as a non-functional signal path, are scrapped or discarded. Only components meeting and passing tests are used to build final shippable computer systems. Typically in large, very dense components, thousands of signal paths are present. The yields of usable components are often very low. In many cases, a yield of fifty percent is considered to be very good.

Therefore, it would be advantageous to have an improved method, apparatus, and computer instructions to handle defects or failures in signal paths between different chips.

SUMMARY OF THE INVENTION

The present invention provides a method, apparatus, and computer instructions for managing a set of signal paths for a chip. A defective signal path within the set of signal paths for the chip is detected. Signals are re-routed through the set of signal paths such that the defective signal path is removed from the set of signal paths and sending signals using remaining data signal paths in the set of signal paths and using an extra signal path in response to detecting the defective signal path.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
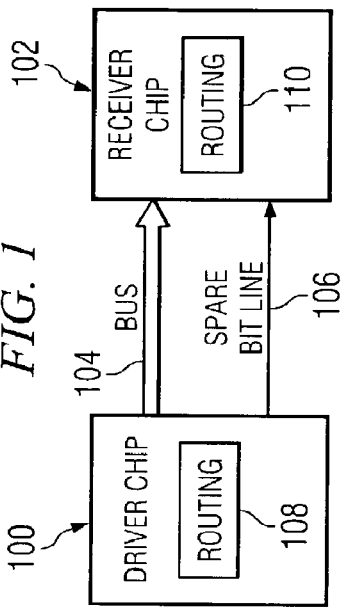
FIG. 1 is a diagram illustrating chips with a self-healing interface in accordance with a preferred embodiment of the present invention.

With reference now to the figures, and in particular to FIG. 1, a diagram illustrating chips with a self-healing interface is depicted in accordance with a preferred embodiment of the present invention. In this example, driver chip 100 sends signals to receiver chip 102 over bus 104. A bus is a common pathway or channel providing a connection between devices. Bus 104 provides a path for signals to travel between driver chip 100 and receiver chip 102. Additionally, spare bit line 106 also provides a connection between driver chip 100 and receiver chip 102.

The mechanism of the present invention employs routing 108 and routing 110 to manage or handle a defective signal path or a failure in a signal path within bus 104. These routing mechanisms, routing 108 and routing 110, allow for driver chip 100 and receiver chip 102 to repair themselves to allow signal paths to be dynamically reconfigured. Such a mechanism allows for defects to exist in the bus while still maintaining operation and functionality for the system. The re-routing provided by the present invention is accomplished by including spare bit line 106. A spare bit line or signal path may be added for each chip. The number of spare signal paths employed may vary depending on the particular implementation. For example, a spare signal path may be added for each bus or group of interconnections. More than one spare signal path may be added for a bus or group of interconnections. Further, the spare signal path, such as spare bit line 106, may be normally functional or nonfunctional, but is not required for complete or partial operation.

During a manufacturing test or during functional operation, if any signal path in bus 104 is detected or diagnosed to be defective, signaling is re-routed around the defective signal path by activating or switching into operation spare bit line 106.

For example, an N-bit wide bus on a send chip, such as driver chip 100, is routed to the chip's drivers and sent across any arbitrary interconnect—module, board, connector, or card to a receiver chip. If, however, a defect is detected on bit 5 for example, all of the configuration latches on bits 6 through N are re-routed using a routing mechanism, such as routing 108. In this manner, the signal paths for the bits are re-routed by steering or routing bit 5 to bit 6, bit 6 to bit 7, and bit 7 to bit 8. This routing continues through the signal paths such that the spare signal path, such as spare bit line 106, is included. Similarly on the receive side, such as at receiver chip 102, the bits are reconfigured, using a routing mechanism, such as routing 110, to route around the defective bit 5.

Normal operation can then take place with the defective signal path being successfully removed. Such a defect could exist on any of the components in the path or on any of the signals on the bus. Further, additional spare signals and steering logic may be added to increase the number of allowed defects. Other variations include, for example, a 72-bit bus that may be steered or narrowed to a 36-bit bus reducing the effective bandwidth of the bus but allowing the customer to remain operational until a service call could be scheduled.

Figure 2:
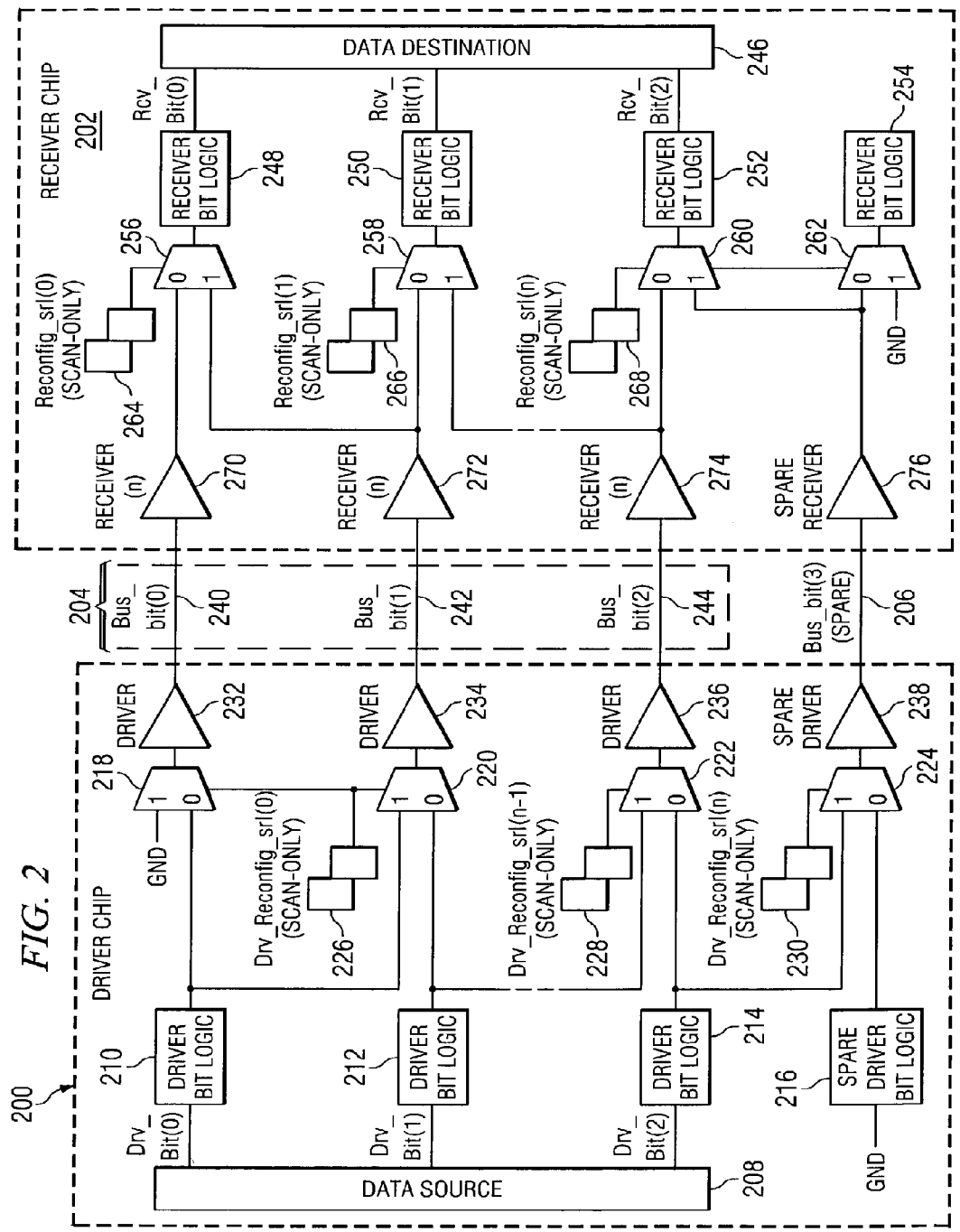
FIG. 2 is a diagram illustrating components used in dynamically routing signal paths in accordance with a preferred embodiment of the present invention.

Turning now to FIG. 2, a diagram illustrating components used in dynamically routing signal paths is depicted in accordance with a preferred embodiment of the present invention. In this example, driver chip 200 sends signals to receiver chip 202 across bus 204. Additionally, spare bit line 206 is used to allow for dynamic reconfiguration of the signal paths in the event a defective signal path is identified.

Driver chip 200 includes data source 208. Data source 208 contains various logic and integrated circuits for providing functionality. Driver chip 200 also includes driver bit logic 210, 212, 214, and 216. These logics provide testing functions that are employed to determine whether defects are present in the signal paths on bus 204 and on spare bit line 206. These components have their inputs connected to data source 208. The output of these components is connected to multiplexers 218, 220, 222, and 224. Most of the multiplexers have an input from two different driver bit logic units. Multiplexer 218 has one input connected to ground with a second input connected to driver bit logic 210. Multiplexer 220 has one input connected to driver bit logic 210 and a second input connected to driver bit logic 212. Multiplexer 222 has one input connected to driver bit logic 212 and a second input connected to driver bit logic 214. Multiplexer 224 has one input connected to driver bit logic 214 and a second input connected to driver bit logic 216.

The select or control input of these multiplexers is connected to configuration latches 226, 228, and 230. The output of multiplexers 218, 220, 222, and 224 is connected to drivers 232, 234, 236, and 238. These drivers are connected to bit lines 240, 242, and 244 in bus 204 with driver 238 being connected to spare bit line 206. In these examples, the multiplexers are 2:1 multiplexers. These multiplexers are added to provide a routing function, such as that in routing 108 in FIG. 1. The select inputs in these multiplexers are used to control or select the input into these components.

These multiplexers are programmable through configuration latches 226, 228, and 230 in these examples. In these examples, the configuration latches are illustrated as scan only latches. In normal operation and in the absence of any defects, the bus is N bits wide and all the configuration latches are set to zero.

If one of the configuration latches is set to one, such a signal changes the routing in the signal paths across bus 204.

In receiver chip 202, data destination 246 contains logic and integrated circuits for providing functions to operate and process signals received across bus 204. Receiver chip 202 also includes receiver bit logic 248, 250, 252, and 254. These components are used in testing for defects in signal paths across bus 204 and spare bit line 206. The input to these components is connected to multiplexers 256, 258, 260, and 262. As with the multiplexers in driver chip 200, the inputs selected by these multiplexers are controlled through latches, such as configuration latches 264, 266, and 268. The inputs to multiplexers 256, 258, 260, and 262 are connected to receivers 270, 272, 274, and 276.

More specifically, multiplexer 256 has one input connected to receiver 270 and a second input connected to receiver 272. Multiplexer 258 has one input connected to receiver 272 and a second input connected to receiver 274. Multiplexer 260 has one input connected to receiver 274 and a second input connected to receiver 276. Finally, multiplexer 262 has one input connected to receiver 276 and a second input connected to ground.

In these examples, four bit lines are illustrated in the bus for purposes of describing the present invention. Such an illustration is not meant as a limitation to the number of lines that may be provided for signal paths in bus 204. Of course, any number of bit lines may be employed depending on the particular implementation. Further, a single spare bit line is illustrated. Additional spare bit lines may be used depending on the particular design or desired configuration.

The configuration latches and multiplexers illustrated in driver chip 200 form the components for a routing mechanism, such as routing 108 in FIG. 1. Similarly, the configuration latches and multiplexers in receiver chip 202 form the components for a routing mechanism, such as routing 110 in FIG. 1.

In these examples, the routing function is illustrated as taking the form of multiplexers controlled by configuration latches. This mechanism is shown as being located between the driver bit logic and the drivers. The location of the mechanism within a chip may change depending on the location in which the critical timing is located. The actual location of this mechanism within the chip will depend on particular design parameters for a specific chip.

Figure 3:
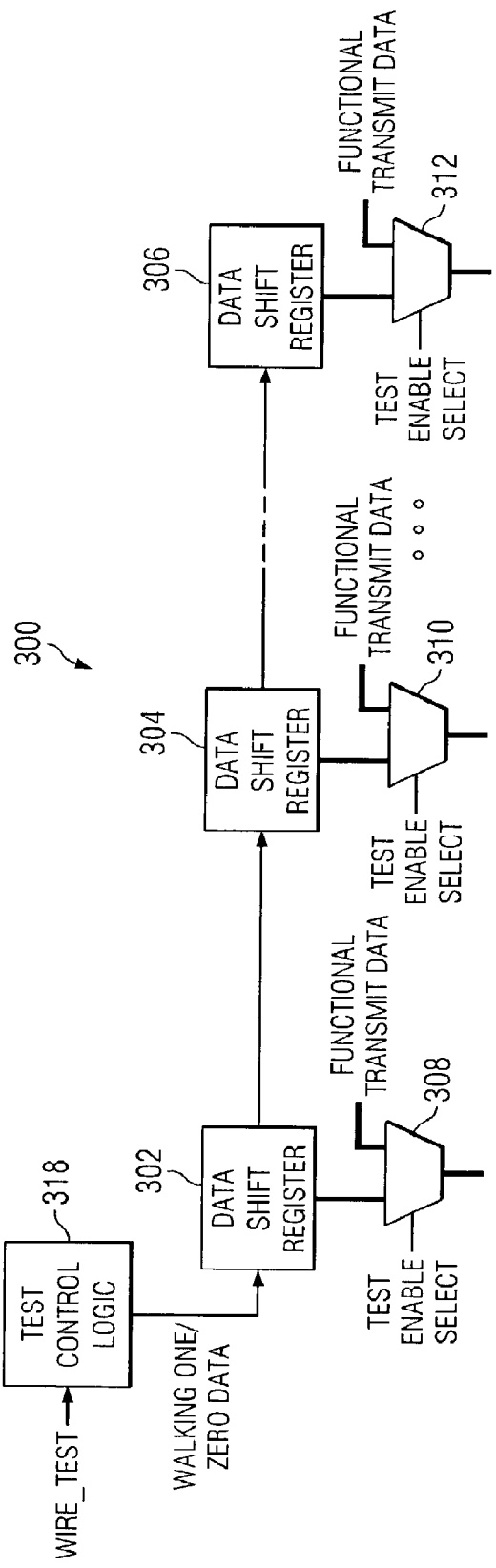
FIG. 3 is a diagram illustrating testing components in a driver chip in accordance with a preferred embodiment of the present invention.

With reference now to FIG. 3, a diagram illustrating testing components in a driver chip is depicted in accordance with a preferred embodiment of the present invention. Testing system 300 is employed to detect defective or failed signal lines in a bus, such as bus 204 in FIG. 2. In this example, testing system 300 includes data shift register units 302, 304, and 306, which form a shift register for testing system 300. Testing system 300 also includes multiplexers 308, 310, and 312. These components are included in the driver bit logic units illustrated in FIG. 2. For example, data shift register unit 302 and multiplexer 308 form a driver bit logic unit, such as driver bit logic 210 in FIG. 2. The output of multiplexers 308, 310, and 312 is connected to multiplexers or other types of re-routing logic used to dynamically re-route signal paths. Multiplexers 308, 310, and 312 serve to allow the functional transmission of data, such as that from a data source, while also allowing for data, such as a test pattern, to be transmitted. The test pattern is generated by test control logic 318 in these examples.

Initially, data shift register units 302, 304, and 306, which form a shift register, are cleared to zero through reset or scanning. In this example, a wire test, commonly used for testing components, may be initiated. In a wire test, every wire or signal path is driven to a logic level zero with all of the receivers expecting a logic level zero. Then, a single signal wire or signal path is changed to a logic level one. The receiver corresponding to the driver is the only receiver expecting a logic level one. This one is then "walked" to the next signal wire in the sequence. With this test, only one wire or signal path in the system is at a logic level one at any time, while all other wires or signal paths are at a logic zero. This test enhances an ability to identify or catch "subtle" opens or shorts between lines. During such a test, a "walking one" is shifted onto the first data shift register, data shift register unit 302 by test control logic 318. This walking one may then be shifted to the next shift register unit until all of the signal paths have been tested. In a similar fashion, a "walking zero" may be employed. The one or zero signal is propagated onto the bus in response to the assertion of a signal, "WIRE_TEST", being applied to test control logic 318. This walking pattern is shifted every 16-bit time on the bus to allow a slow checking of bus signals. This walking one is then sent to data shift register unit 304 by data shift register unit 302. The walking one may later be sent to data shift register unit 306.

Figure 4:
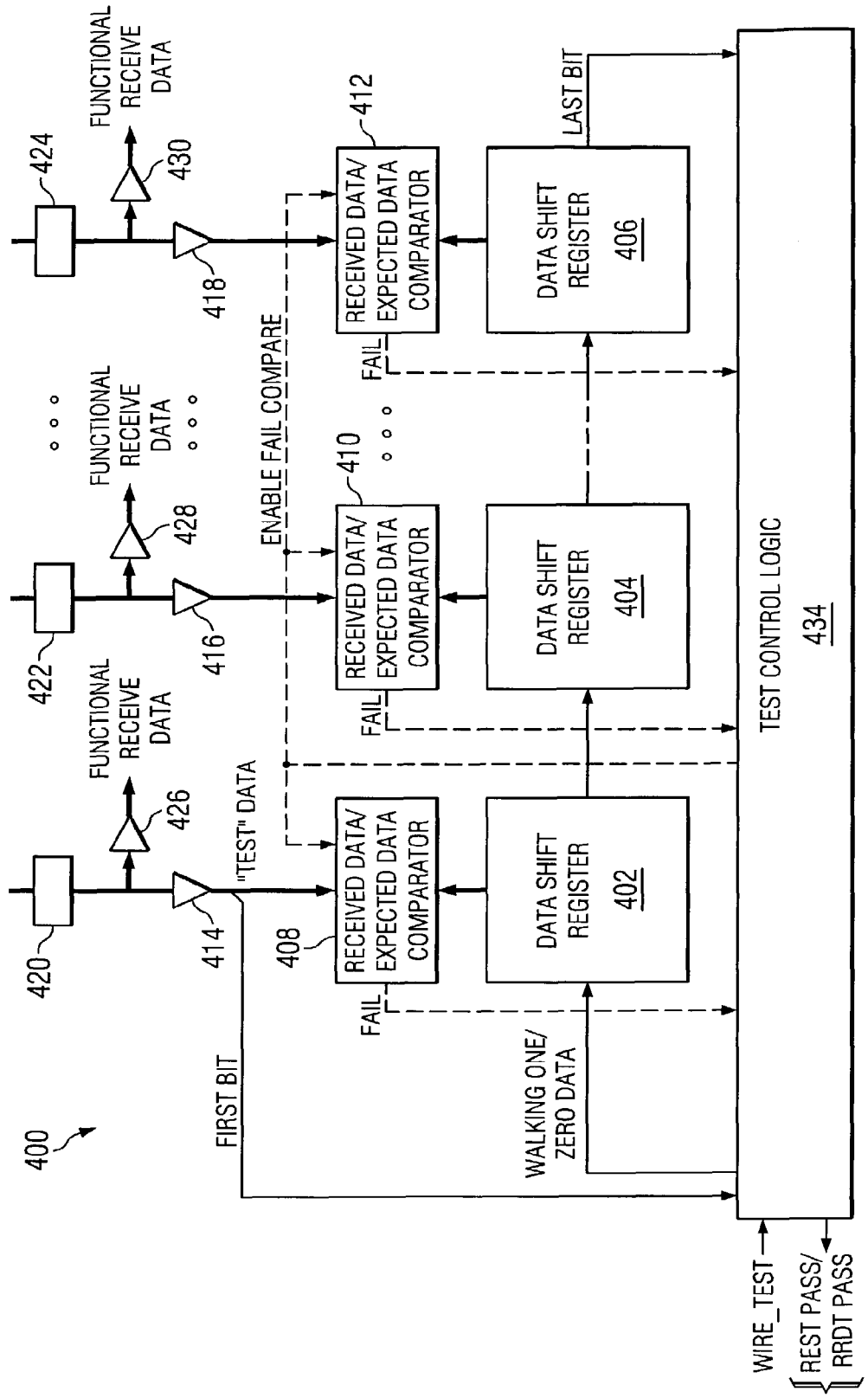
FIG. 4 is a diagram illustrating testing components in a receiver ship in accordance with a preferred embodiment of the present invention.

Turning now to FIG. 4, a diagram illustrating testing components in a receiver ship is depicted in accordance with a preferred embodiment of the present invention. Testing system 400 is located in a receiver chip, such as receiver chip 202 in FIG. 2.

In this example, testing system 400 includes data shift register units 402, 404, and 406, which form a shift register. This testing system also includes received data/expected data comparators 408, 410, and 412. Data is received in these comparators from the data shift registers as well as from receivers 414, 416, and 418. The input of these receivers is connected to scan latches 420, 422, and 424. The output of these scan latches also is connected to receivers 426, 428, and 430. These receivers provide a path to a data destination for data signals. Scan latches 420, 422, and 424 are connected to multiplexers or other routing units used to dynamically reconfigure signal paths.

In this example, the scan latches, receivers, comparators, and data shift registers are components located in receiver bit logic units, such as those illustrated in FIG. 2. For example, scan latch 420, receiver 426, receiver 414, received data/expected data comparator 408, and data shift register unit 402 are components found in a single receiver bit logic unit, such as receiver bit logic 252 in FIG. 2. A test using these data shift registers may be initiated by test control logic 434. The test control logic may be located off the chip and provide signals to the chip on which these data shift registers are located.

Initially, these data shift registers are reset to zero through reset/scanning. Wire testing as well as random data tests may be performed using these components. In a similar fashion, a walking one or zero may be shifted into the data shift registers for comparison with signals received from the transmitting chip, such as signals generated by test system 300 in FIG. 3. In a similar fashion, data may be shifted into these shift registers for comparison.

In this manner, the testing systems illustrated in FIGS. 3 and 4 allow for the identification of defective or failed signal paths in a bus. Further, these specific examples are intended as illustrations of one implementation in which testing may be implemented. Of course, other types of testing systems or components may be employed depending on the particular design. Based on these signals, dynamic re-routing of signal paths may be initiated.

Figure 5A:
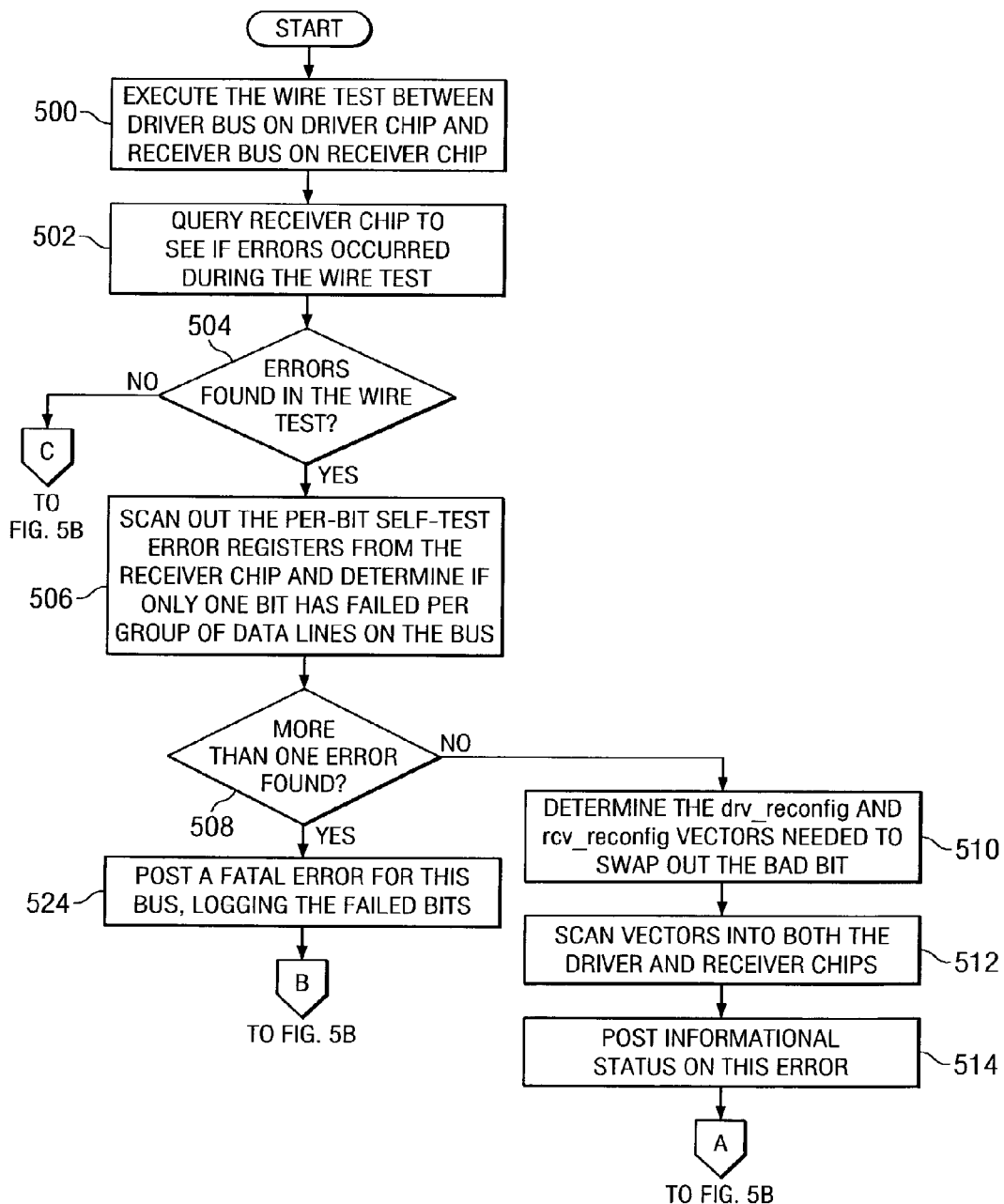
FIGS. 5A and 5B are flowcharts of a process used for testing and re-routing signal paths in accordance with a preferred embodiment of the present invention.
Figure 5B:
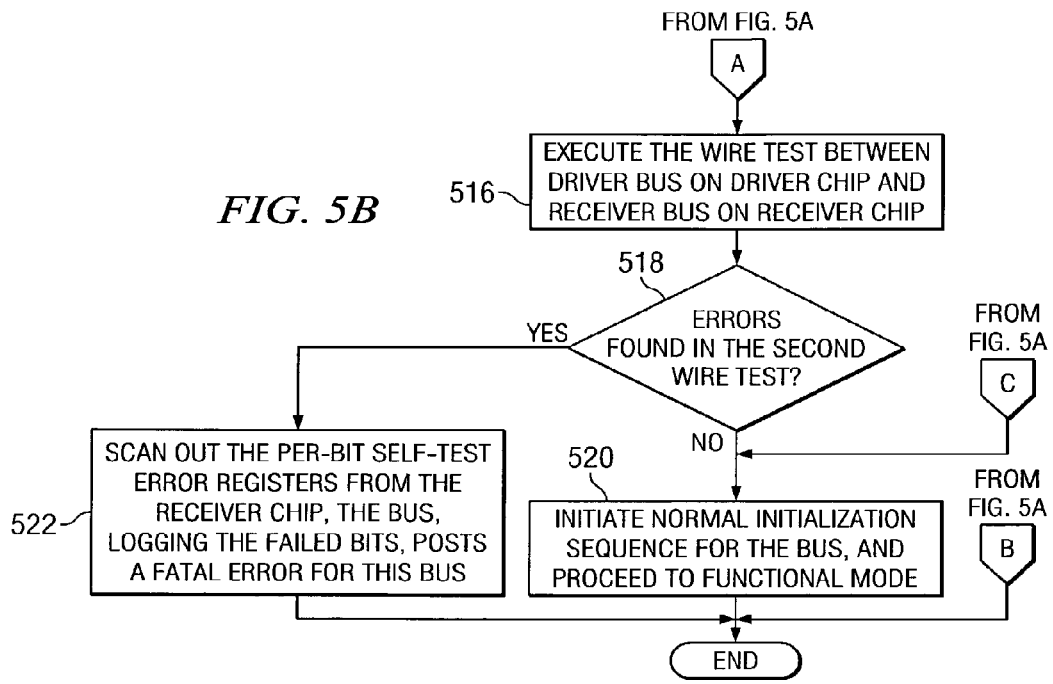

With reference now to FIGS. 5A and 5B, flowcharts of a process used for testing and re-routing signal paths are depicted in accordance with a preferred embodiment of the present invention. The process illustrated in FIGS. 5A and 5B may be implemented in a routing mechanism, such as routing 108 and routing 110 in FIG. 1. The steps illustrated in these figures may be implemented as instructions executed by a processor on the chip or in hardware. These routing functions also could be implemented in a specific routing chip separate from the chips providing the functions. The particular location of the routing function will depend on where the critical timing for the signal paths is located.

The process begins by executing a wire test between the driver bus on the driver chip and the receiver bus on the receiver chip (step 500). This test may be implemented using components, such as those illustrated in FIGS. 3 and 4 above. The receiver chip is queried to see if errors occurred during the wire test (step 502). A determination is made as to whether errors are found in the wire test (step 504). If errors are found in the wire test, the per-bit self-test error registers are scanned out from the receiver chip and a determination is made as to whether only one bit has failed per group of data lines on the bus (step 506). The grouping of data lines to a spare bit line may change depending on different implementations. Further, more than one spare bit line may be associated with a group of data lines.

Next, a determination is made as to whether more than one error is found (step 508). If more than one error is not found, the drv_reconfig and rcv_reconfig vectors needed to swap out the bad bit are determined (step 510). In step 510, the contents of the reconfiguration latches are identified. The vectors are basically the contents of the reconfiguration latches.

The vectors are scanned into both the driver and the receiver chips (step 512). The scanning of vectors into the chips is employed to re-route the signal paths to exclude the failed or defective signal path and include the spare signal path provided by a spare bit line. Informational status is posted on this error (step 514). After each self-test, a self-test pass or a self-test fail signal is passed to the control logic, such as test control logic 434 in FIG. 4. If a self-test fail is reported, the test control logic may scan/read out the contents of the error latches from the receiver. This information may be placed into reconfiguration latch data and loaded into the configuration latches in both the driver chip and the receiver chip to reconfigure the signal paths. The wire test is executed between the driver on the driver chip and the receiver bus on the receiver chip (step 516).

A determination is made as to whether additional errors are found in a second wire test (step 518). If additional errors are not found in the second wire test, a normal initialization sequence is initiated for the bus and the chip is placed into a functional mode (step 520) with the process terminating thereafter.

Returning again to step 518, if additional errors are found in the second wire test, the per-bit self-registers are scanned out from the receiver chip, the bus, the failed bits are logged, a fatal error is posted for this bus (step 522) and the process terminates thereafter. With reference again to step 508, if more than one error is found, a fatal error is posted for this bus, the failed bits are logged (step 524) and the process terminates thereafter. Turning again to step 504, if no errors are found in wire test, the process proceeds to step 520 as described above.

The testing and reconfiguration of the bus described in FIG. 5 may occur during different times, such as during manufacturing tests, during normal power on of a system, or at any time when normal bus error detection indicates a failure or failures on the bus. This normal bus error detection may include, for example, parity checking or error detection/correction coding.

Figure 6:
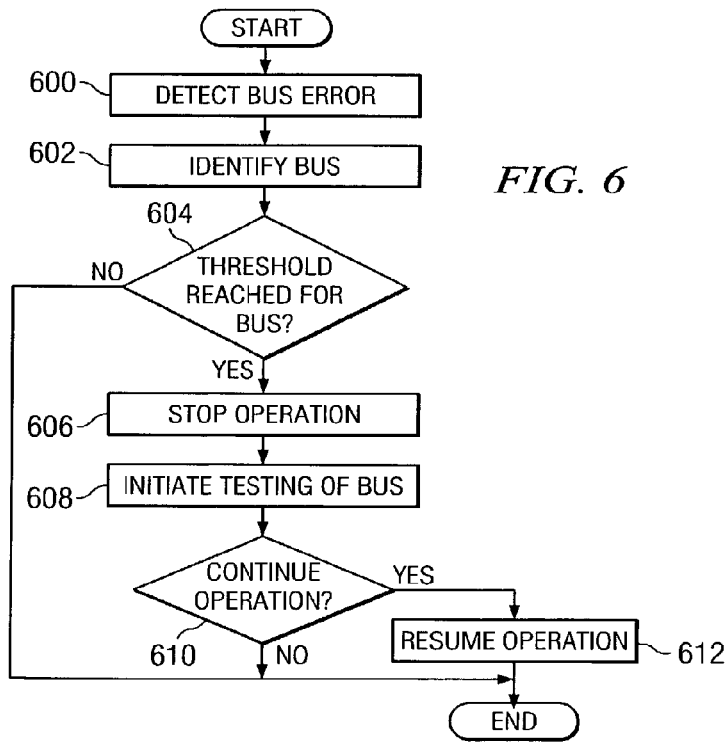
FIG. 6 is a flowchart of a process for detecting bus errors during functional operation and re-routing signal paths on a bus in accordance with a preferred embodiment of the present invention.

Additionally, the mechanism of the present invention may be implemented within a computer system in which monitoring is performed for errors. Turning now to FIG. 6, a flowchart of a process for detecting bus errors during functional operation and re-routing the signal paths on a bus is depicted in accordance with a preferred embodiment of the present invention. The process illustrated in FIG. 6 may be implemented in a data processing system, such as, for example, a personal computer, a workstation, or a server computer. The detection performed by the process in FIG. 6 may occur during functional operation of the bus to allow repairs or reconfiguration of a failing bus. This testing may use standard error detection methods, such as error detection/correction coding (ECC).

The process begins by detecting a bus error (step 600). The bus on which the error occurred is identified (step 602). A determination is made as to whether a threshold error level has been reached for the bus (step 604). When a threshold error level is detected on the particular bus, operation or data transfers on the bus are halted (step 606). In this step, the computer enters a diagnostic mode. In this mode, testing of the bus is initiated (step 608). The testing executed in step 608 employs the steps described with respect to FIGS. 5A and 5B above.

A determination is then made as to whether operation of the computer system may continue (step 610). This step employs information returned by the testing performed on the bus to determine whether defective or failed signal paths are present and whether these defects or failures are correctable. If operation can be continued, the operation of the system resumes (step 612) with the process terminating thereafter. Otherwise, the process terminates without resuming operation of the computer system. Returning again to step 604, if the threshold for the bus has not been reached, the process terminates.

The detection of a bus error in step 600 may be implemented using a double-bit error detect/single-bit error scheme in addition to other well-known error detection schemes. With this type of error detection, a single-bit error in a bus can be detected and corrected without causing a system data integrity error, while two bits failing will indicate an error. Two failing bits result in an inability to correct the error, thus causing a system data integrity error. If, during operation, a bus experiences multiple single-bit errors, the bus may indicate a "hard" failure, such as, for example, a wire has "opened up". If the "threshold" number of these single-bit/correctable errors has been reached on the bus, the normal bus operation can be stopped, and the bus may be tested for these "hard" fails via the previously described wire test mechanism, and the hard failure "healed" by the reconfiguration mechanism described above. Thus, if during operation, a potential hard fail is detected, (via multiple single-bit errors), that hard failure can be corrected via the self-healing bus mechanism before any potentially uncorrectable error (soft or hard) caused by two bits failing (an "uncorrectable ECC error") occurs on the bus.

In the detection of the bus error in step 600, it also is possible, by analyzing the "syndrome" bits in the ECC mechanism, to identify the failing bit on the bus. As described above, step 600 may be implemented using well-known ECC algorithms. If multiple cases of failure of the same bit occur as detected by the threshold mechanism inferred in step 604, this situation may indicate a bus signal which, due to noise or interference or some other mechanism, is "error-prone", a so-called "soft error". If this soft error occurs repeatedly on the same bit, the process described in steps 510 and 512 of FIG. 5, may be employed without performing the wire test described in steps 501 and 502 to reconfigure the bus to swap out the signal line identified by the ECC mechanism.

Thus both hard errors, detected by wire test, or soft errors, detected by error detection/correction coding techniques) can be used to detect faulty signals, and the invention used to reconfigure around these failures employed.

Although ECC encoding techniques have been described as example implementations for detecting errors, any error detection method may be employed to detect hard or soft errors. Once such an error is detected and isolated to a single failing data path, the mechanism of the present invention may be used to reconfigure the bus to eliminate the faulty data path and use the spare data path.

Thus, the present invention provides an improved method, apparatus, and computer instructions for a self-healing chip-to-chip interface. The mechanism provides this interface through dynamic reconfiguration of signal paths between chips. When a defective or failed signal path is identified, the signals are re-routed to exclude the use of that signal path and include a spare signal path. The extent of re-routing that may occur depends on the number of spare signal paths provided on the chip. In addition, in some cases reduced bandwidth may be employed by reconfiguring the signal paths to send less data bits. In this manner, continued functionality or limited functionality may be provided until a chip or component can be replaced. Further, if a spare signal path is used in place of a defective one, the yield of components may increase because such a component may be considered a good or passing component, rather than a defective one.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A chip comprising
    a plurality of signal paths, wherein the plurality of signal paths comprise a plurality of switch-able driver circuits connected to respective data source circuits of a plurality of data source circuits as defined by switch control logic, wherein according to a first setting of said switch control logic, a first signal path comprises a first data source circuit of the plurality of data source circuits connected to a first switch-able driver of the plurality of switch-able drivers, and wherein according to the first setting of said switch control logic, a second signal path comprises a second data source circuit of the plurality of data source circuits connected to a second switch-able driver of the plurality of switch-able drivers, the chip performing a method comprising:
    transmitting a signal from the chip over the plurality of signal paths;
    detecting an error in the transmitted signal;
    responsive to the detecting the error, reconfiguring the plurality of signal paths, wherein reconfiguring comprises setting the switch control logic to a second setting of said switch control logic, wherein according to the second setting of said switch control logic the second signal path comprises the first data source circuit of the plurality of data source circuits connected to the second switch-able driver of the plurality of switch-able drivers, wherein the second data source circuit of the plurality of data source circuits is not connected to the second switch-able driver of the plurality of switch-able drivers, and wherein reconfiguring forms a reconfigured plurality of signal paths;

transmitting the signal over the reconfigured plurality of signal paths;

wherein the switch control logic comprises latch controlled multiplexers, wherein the first setting of the switch control logic sets a first latch to a first state, wherein the second setting of the switch control logic sets the first latch to a second state, wherein if the first latch is the first state then a multiplexer connects the second data source to the second switch-able driver, and wherein if the first latch is the second state then the multiplexer connects the first data source to the second switch-able driver; and wherein the second signal path is a functional signal path, wherein the functional signal path is not required for complete or partial operation.

2. The chip of claim 1, wherein detecting an error comprises any one of a walking ones test, a walking zeros test or normal bus error detection comprising error detection/correction coding.

3. The chip of claim 1, wherein reconfiguring is performed dynamically in a user environment.

4. The chip of claim 1, wherein detecting an error is performed by logic connected to said plurality of data source circuits.

* * * * *